(12) United States Patent
Chen et al.

(10) Patent No.: US 8,108,175 B2
(45) Date of Patent: Jan. 31, 2012

(54) METHOD FOR DETERMINING SELF-HEATING FREE I-V CHARACTERSTICS OF A TRANSISTOR

(75) Inventors: Oiang Chen, Sunnyvale, CA (US); Zhi-Yuan Wu, Union City, CA (US); Richard Yu-Kuwan Su, Berkeley, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 967 days.

(21) Appl. No.: 11/585,006

(22) Filed: Oct. 23, 2006

(65) Prior Publication Data

US 2008/0105891 A1    May 8, 2008

(51) Int. Cl.
*G01K 1/00* (2006.01)
(52) U.S. Cl. ....................................................... 702/130
(58) Field of Classification Search ........................ None
See application file for complete search history.

(56) References Cited

U.S. PATENT DOCUMENTS

2008/0157128 A1*  7/2008  Katz et al. ..................... 257/215

OTHER PUBLICATIONS

Jenkins, K.A. and Sun, J.Y.-C., Measurement of I-V Curves of Sllicon-on-Insultaor (SOI) MOSFET's Without Self-Heating, IEEE Electron Device Letters, vol. 16, No. 4, p. 145-1147 (Apr. 1995).*

* cited by examiner

*Primary Examiner* — Aditya Bhat
(74) *Attorney, Agent, or Firm* — Farjami & Farjami LLP

(57) ABSTRACT

According to one exemplary embodiment, a method for determining a self-heating free drain current in a transistor corresponding to a channel temperature not affected by a drain DC current includes measuring at least three unique drain currents of a transistor corresponding to at least three unique ambient temperatures. The method further includes determining at least three unique channel temperatures of the transistor corresponding to the at least three unique drain currents, thereby establishing a current-temperature relationship for the transistor. The method further includes determining the self-heating free drain current of the transistor utilizing the current-temperature relationship.

18 Claims, 5 Drawing Sheets

METHOD FOR DETERMINING SELF-HEATING FREE I-V CHARACTERSTICS OF A TRANSISTOR

1. TECHNICAL FIELD

The present invention relates generally to the field of semiconductor devices. More particularly, the present invention is related to semiconductor device testing and modeling.

2. BACKGROUND ART

A transistor, such as a field effect transistor ("FET") formed on a silicon-on-insulator ("SOI") substrate, can exhibit "self-heating" under DC operation. "Self-heating" refers to an increase in the temperature of a transistor, such as an SOI transistor, over ambient temperature that can occur under DC operation as a result of large power generation and poor thermal conductivity of the transistor. As a result of self-heating, I-V characteristics obtained during DC measurements of the transistor may not accurately represent the actual I-V response of the transistor under AC operation. Consequently, self-heating can cause inaccuracies in a transistor model based on I-V characteristics obtained under transistor DC operation. Therefore, to extract an accurate transistor model for use in circuit design, it is necessary to obtain "self-heating free" I-V characteristics of the transistor.

Conventional methods for obtaining the self-heating free I-V characteristics of a transistor, such as an SOI transistor, have been inefficient and inaccurate. For example, a conventional approach uses nanosecond short pulse measurement to reconstruct a self-heating free I-V curve by injecting a short voltage pulse and measuring the current flowing from the transistor's drain. However, this conventional approach requires a complicated setup and does not necessarily yield results accurate enough for transistor model extraction. Another conventional approach uses AC conductance integration to extract self-heating free I-V curves. In the AC conductance integration approach, the output and drain impedances of a transistor are measured at different frequencies, and then the thermal capacitance is extracted based on mathematical assumptions. However, AC conductance integration is not effective for modeling the self-heating free I-V characteristics of a transistor, and is even less accurate than the nanosecond pulse approach.

SUMMARY

A method for determining self-heating free I-V characteristics of a transistor, substantially as shown in and/or described in connection with at least one of the figures, as set forth more completely in the claims.

DETAILED DESCRIPTION OF THE INVENTION

The present invention is directed to a method for determining self-heating free I-V characteristics of a transistor. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

The present invention provides an innovative method of determining self-heating free drain and substrate currents of a transistor, such as a FET, to determine self-heating free I-V characteristics of the transistor. Although a transistor situated on an SOI substrate, i.e., an SOI transistor, is utilized to illustrate the present invention, the present invention can also be utilized to determine self-heating free I-V characteristics of a transistor, such as a FET, situated on a bulk silicon substrate.

Figure 1A:
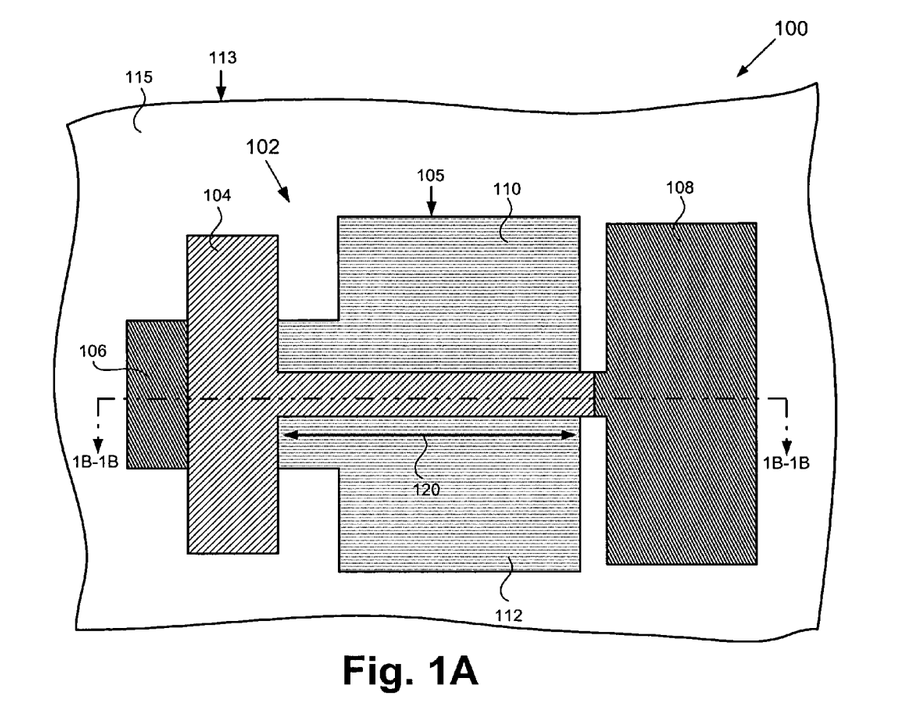
FIG. 1A illustrates a top view of an exemplary structure including an exemplary silicon-on-insulator transistor.

FIG. 1A shows a top view of an exemplary test structure, which includes an exemplary transistor situated on an SOI (silicon-on-insulator) substrate. Certain details and features have been left out of FIG. 1A, which are apparent to a person of ordinary skill in the art. Test structure 100, which includes transistor 102, can be situated on a semiconductor die or semiconductor wafer, for example. Transistor 102 is an exemplary transistor that can be used to illustrate the invention's method of determining self-heating free transistor drain and substrate currents during DC operation. Transistor 102, which can be a FET, for example, includes gate 104 and semiconductor body 105, which includes source/drain regions 110 and 112 and semiconductor body contacts 106 and 108. SOI substrate 113 includes silicon layer 115, an insulating layer (not shown in FIG. 1A), and a bulk silicon layer (also not shown in FIG. 1A), as known in the art.

As shown in FIG. 1A, gate 104 is situated over semiconductor body 105, which is situated in silicon layer 115. Gate 104 can comprise polysilicon or metal, for example, and can be formed in a manner known in the art. Also shown in FIG. 1A, source/drain regions 110 and 112 are situated in silicon layer 115 and separated by a channel region (not shown in FIG. 1A), which is situated under gate 104 and which has width 120. Source/drain regions 110 and 112 can be heavily doped with a suitable N type dopant, for example. Ohmic contacts (not shown in FIG. 1A) can be formed on each of source/drain regions 110 and 112 to provide source/drain connectivity. Further shown in FIG. 1A, semiconductor body contacts 106 and 108 are situated in silicon layer 115 and can be heavily doped with a suitable P type dopant, for example.

Figure 1B:
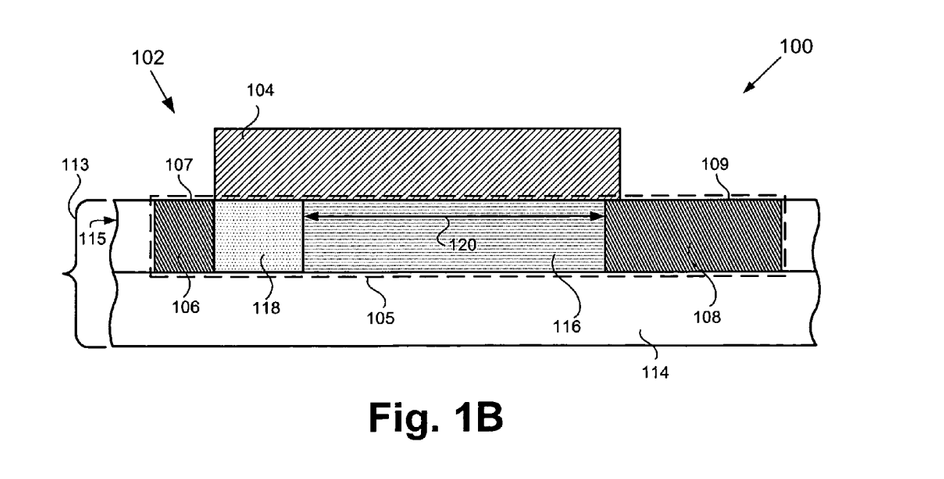
FIG. 1B illustrates a cross sectional view of the exemplary structure of FIG. 1A.

FIG. 1B shows a cross-sectional view of exemplary structure 100 across line 1B-1B in FIG. 1A. In particular, transistor 102, gate 104, semiconductor body 105, semiconductor body contacts 106 and 108, SOI substrate 113, silicon layer 115, and channel width 120 in FIG. 1B correspond to the same elements in FIG. 1A. In addition to source/drain regions 110 and 112 (shown in FIG. 1A) and semiconductor body contacts 106 and 108, semiconductor body 105 also includes lightly doped region 118 and channel region 116.

As shown in FIG. 1B, silicon layer 115 is situated over insulating layer 114, which forms a portion of SOI substrate 113. Insulating layer 114, which can comprise silicon oxide, for example, is situated over a bulk silicon layer (not shown in FIG. 1B). Also shown in FIG. 1B, light doped region 118 is situated under gate 104 in silicon layer 115 and can be a lightly doped P type region, for example. Further shown in FIG. 1B, channel region 116 is situated under gate 104 and situated in silicon layer 115 between source/drain regions 110 and 112 (shown in FIG. 1A). Channel region 116, which has width 120, can comprise a P type region, for example.

Also shown in FIG. 1B, semiconductor body contact 106 is situated adjacent to and in direct electrical contact with lightly doped region 118 in silicon layer 115 and semiconductor body contact 108 is situated adjacent to and in direct electrical contact with channel region 116. Ohmic contacts (not shown in FIG. 1B) can be situated on respective top surfaces 107 and 109 of semiconductor body contacts 106 and 108.

In test structure 100, various operating parameters of transistor 102, such as the drain and substrate current, can be measured under DC operation. For example, by applying appropriate bias voltages to gate 104 and source/drain regions 110 and 112, the current flowing between source/drain regions 110 and 112, i.e. the drain current, can be measured. Also, by utilizing ohmic contacts (not shown in FIGS. 1A and 1B) situated on top surfaces 107 and 109 of semiconductor body contacts 106 and 108, respectively, the substrate current, i.e. the current flowing through semiconductor body 105, of transistor 102 can be measured. The drain and substrate currents of transistor 102 can be utilized to provide I-V characteristics for transistor modeling for use in circuit design.

However, under DC operation, self-heating in transistor 102 can cause a transistor model based on the measured drain and substrate currents discussed above to be inaccurate. The present invention provides a method, as discussed below in relation to FIGS. 2 and 3, for determining self-heating free drain and substrate currents of a transistor, such as transistor 102 in test structure 100 in FIG. 1, to provide self-heating free I-V characteristics for more accurate transistor model extraction.

Figure 2:
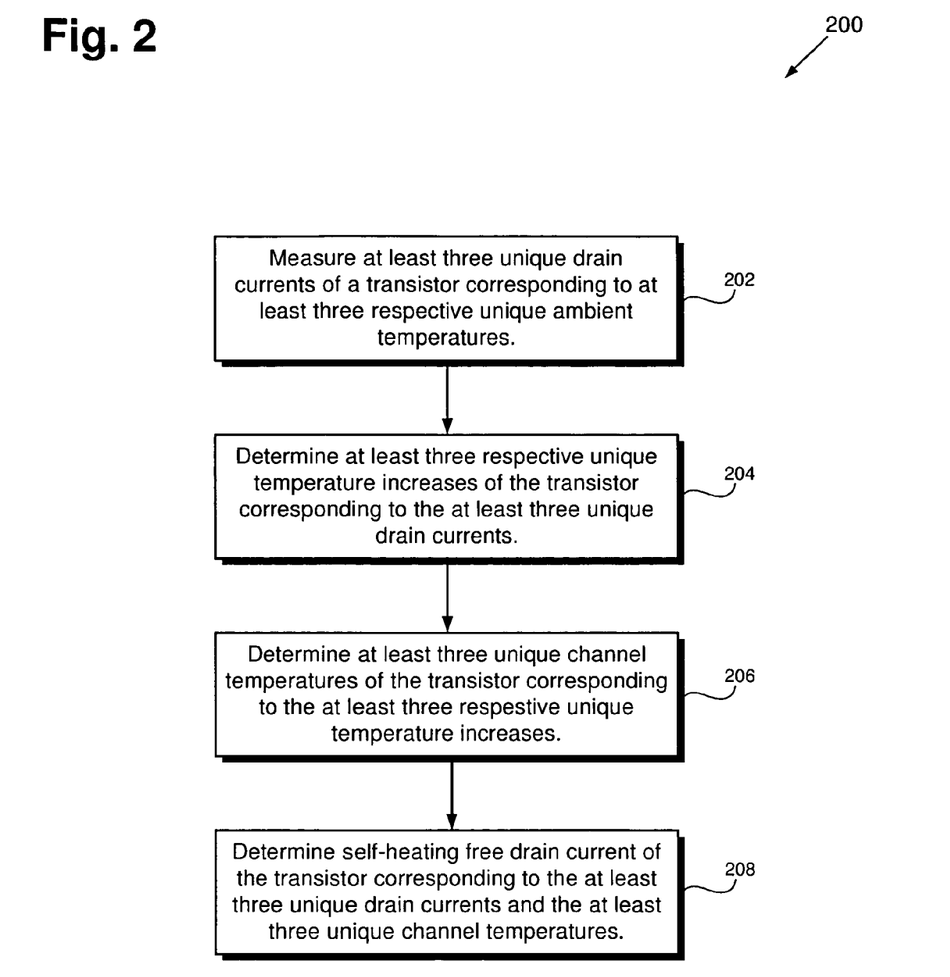
FIG. 2 is a flowchart illustrating steps taken to implement one embodiment of the present invention.

FIG. 2 shows a flowchart illustrating an exemplary method according to an embodiment of the present invention. Certain details and features have been left out of flowchart 200 that are apparent to a person of ordinary skill in the art. For example, a step may consist of one or more substeps or may involve specialized equipment or materials, as known in the art. Flowchart 200 illustrates the invention's method of determining self-heating free drain current of transistor 102 in test structure 100 in FIGS. 1A and 1B, where transistor 102 can be an SOI FET, for example.

At step 202 of flowchart 200, at least three unique drain currents of transistor 102 in test structure 100 are measured corresponding to at least three respective unique ambient temperatures. The ambient temperature refers to the temperature of the environment outside of the semiconductor die or semiconductor wafer on which test structure 100 is fabricated. For example, if test structure 100 is situated in a semiconductor wafer that is mounted on a wafer chuck, the temperature of the wafer chuck would correspond to the ambient temperature. The at least three unique drain currents are measured by varying the ambient temperature while keeping the DC operating voltages, i.e., the drain, gate, and substrate voltages, of transistor 102 constant. For example, three unique drain currents of transistor 102 can be provided by measuring drain current at each of three unique ambient temperatures. In other embodiments, more than three unique drain currents can be measured at each of a corresponding number of unique ambient temperatures.

At step 204 of flowchart 200, at least three unique temperature increases of transistor 102 in test structure 100 are determined corresponding to the at least three respective unique ambient temperatures utilized at step 202 of flowchart 200. The temperature increase of transistor 102 can be expressed by the equation:

$$\delta_{T,i}=I_{D,i} \cdot V_{DS} \cdot R_{th0}/W (i=1,2,3) \qquad \text{equation (1)}$$

where $I_{D,i}$ is the drain current measured at a given ambient temperature, $V_{DS}$ is the drain to source voltage applied to transistor 102, $R_{th0}$ is the normalized thermal resistance of transistor 102 as known in the art, and W is the channel width of transistor 102. Thus, by utilizing equation (1), at least three temperature increases can be determined corresponding to the at least three respective drain currents measured at step 202 of flowchart 200. For example, when i=1 in equation (1), $\delta_{T,1}$ corresponds to a first temperature increase determined by using a first drain current of transistor 102 that was measured at a first ambient temperature. Similarly, when i=2 in equation (1), $\delta_{T,2}$ corresponds to a second temperature increase determined by using a second drain current of transistor 102 that was measured at a second ambient temperature, and so forth.

At step 206 of flowchart 200, at least three unique channel temperatures of structure 100 are determined corresponding to the at least three unique temperature increases of transistor 102 determined at step 204 of flowchart 200. The channel temperature of structure 100 can be expressed by the equation:

$$T_{D,i}=T_i+\delta_{T,i} (i=1,2,3) \qquad \text{equation (2)}$$

where $T_i$ is the ambient temperature of transistor 102 and $\delta_{T,i}$ is the temperature increase determined at step 204 of flowchart 200 at a given unique ambient temperature, $T_i$. Therefore, at least three unique channel temperatures are determined in step 206 of flowchart 200. For example, when i=1 in equation (2), $T_{D,1}$ corresponds to a first unique channel temperature determined by using a first ambient temperature of structure 100. Similarly, when i=2 in equation (2), $T_{D,2}$ corresponds to a second unique channel temperature determined by using a second ambient temperature of structure 100, and so forth.

At step 208 of flowchart 200, the self-heating free drain current of transistor 102 is determined at any given ambient temperature by utilizing the drain current measurements from step 202 of flowchart 200 and the channel temperatures determined at step 206 of flowchart 200. For example, the self-heating free drain current of transistor 102 can be expressed by the equation:

$$I_{D,i}=a_0+a_1 T_{D,i}+a_2 T_{D,i}^2 (i=1,2,3) \qquad \text{equation (3)}$$

where $I_{D,i}$ is the self-heating free drain current of transistor 102, $T_{D,i}$ is the unique channel temperature at a given ambient temperature of transistor 102, and $a_0$, $a_1$, and $a_2$ are unknown quadratic coefficients of equation (3).

The at least three unique channel temperatures determined at step 206 of flowchart 200 and equation (3) provide a system of three equations with three unknowns, namely the quadratic coefficients $a_0$, $a_1$, and $a_2$. This system of equations can be solved to obtain the self-heating free drain current of transistor 102, as defined by the equation:

$$I_{DX}=a_0+a_1 T_X+a_2 T_X^2 \qquad \text{equation (4)}$$

where $T_X$ is a desired temperature and $I_{DX}$ is the self-heating free drain current of transistor 102 at $T_X$.

Thus, the embodiment of the invention in FIG. 2 provides a method for advantageously determining the self-heating free drain current of a transistor, such as an SOI FET, at a desired temperature. It is noted that the invention's method, as described above, results, among other things, in an accurate current-temperature relationship or model, and also in an accurate determination of self-heating free drain current, thereby facilitating designing, and improving the design and fabrication of, circuits and semiconductor dies to achieve performance and characteristics that closely match the simulated or anticipated behavior of such circuits and semiconductor dies.

Figure 3:
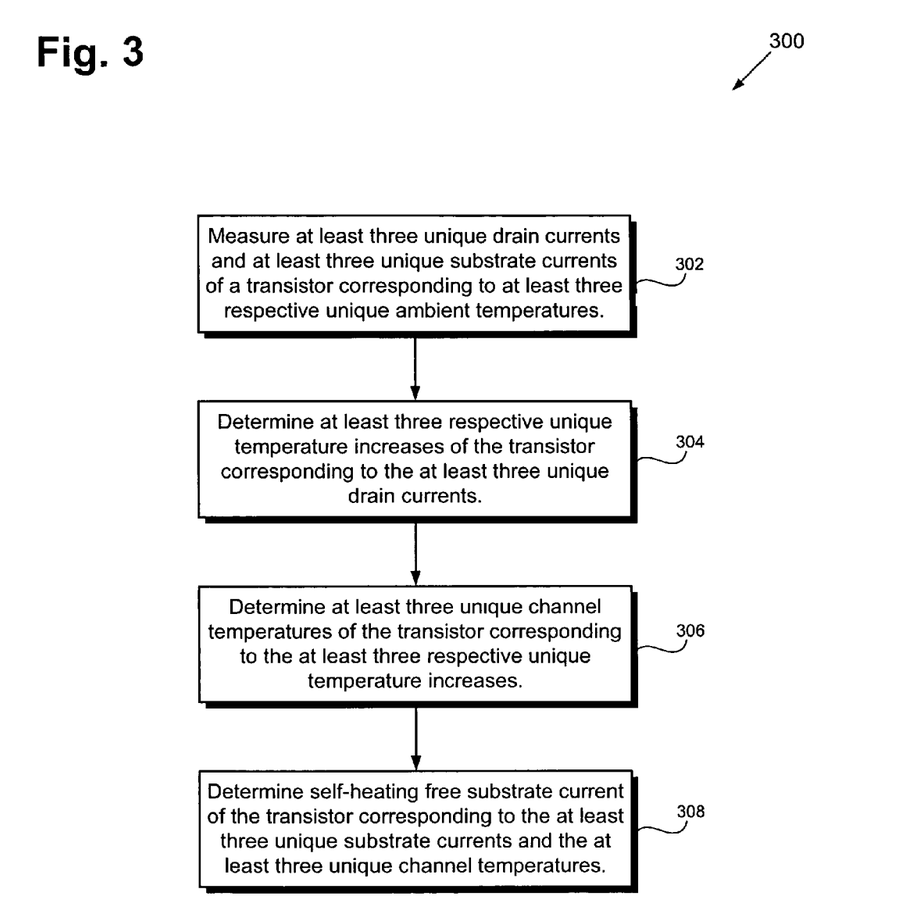
FIG. 3 is a flowchart illustrating steps taken to implement one embodiment of the present invention.

FIG. 3 shows a flowchart illustrating an exemplary method according to an embodiment of the present invention. Certain details and features have been left out of flowchart 300 that are apparent to a person of ordinary skill in the art. For example, a step may consist of one or more substeps or may involve specialized equipment or materials, as known in the art. Flowchart 300 illustrates the invention's method of determining self-heating free substrate current of transistor 102 in test structure 100 in FIGS. 1A and 1B, where transistor 102 can be an SOI FET, for example.

At step 302 of flowchart 300, at least three unique drain currents and at least three unique substrate currents of transistor 102 are measured corresponding to at least three respective unique ambient temperatures. The at least three unique drain currents and the at least three unique substrate currents are measured by varying the ambient temperature as defined above while keeping the DC operating voltages, i.e., the drain, gate, and substrate voltages, of transistor 102 constant. For example, a first drain current and a first substrate current of transistor 102 can be measured at a first ambient temperature. These measurements are then repeated at least two more times at different ambient temperatures, resulting in at least three unique drain currents and at least three unique substrate currents corresponding to at least three respective unique ambient temperatures.

At step 304 of flowchart 300, at least three unique temperature increases of transistor 102 are determined corresponding to the at least three respective unique ambient temperatures of step 302 of flowchart 300. The temperature increase of transistor 102 can be expressed by equation (1) discussed above in the embodiment of the invention in FIG. 2. By utilizing equation (1), at least three temperature increases can be determined corresponding to the at least three respective drain currents measured at step 302 of flowchart 300. For example, when i=1 in equation (1), $\delta_{T,1}$ corresponds to a temperature increase determined by using a first drain current at a first ambient temperature. Similarly, when i=2 in equation (1), $\delta_{T,2}$ corresponds to a temperature increase determined by using a second drain current at a second ambient temperature, and so forth.

At step 306 of flowchart 300, at least three unique channel temperatures of transistor 102 are determined corresponding to the at least three respective unique temperature increases determined at step 304 of flowchart 300. The at least three unique channel temperatures of transistor 102 can be determined by utilizing equation (2) discussed above, where $\delta_{T,i}$ is the temperature increase determined at step 304 of flowchart 300 at a given unique ambient temperature, $T_i$. Therefore, at least three unique channel temperatures are determined in step 306 of flowchart 300. For example, when i=1 in equation (2), $T_{D,1}$ corresponds to a first unique channel temperature determined by using a first ambient temperature. Similarly, when i=2 in equation (2), $T_{D,2}$ corresponds to a second unique channel temperature determined by using a second ambient temperature, and so forth.

At step 308 of flowchart 300, the self-heating free substrate current of transistor 102 can be determined at any given ambient temperature by utilizing the substrate current measurements from step 302 of flowchart 300 and the channel temperatures determined at step 306 of flowchart 300. For example, the self-heating free substrate current of transistor 102 can be expressed by the equation:

$$I_{S,i} = b_0 + b_1 T_{D,i} + b_2 T_{D,i}^2 \quad (i=1,2,3) \qquad \text{equation (5)}$$

where $I_{S,i}$ is the self-heating free substrate current of transistor 102, $T_{D,i}$ is the unique channel temperature at a given ambient temperature of transistor 102, and $b_0$, $b_1$, and $b_2$ are the unknown quadratic coefficients of equation (5).

The at least three unique channel temperatures determined at step 306 of flowchart 300 and equation (5) provide a system of three equations with three unknowns, namely the quadratic coefficients $b_0$, $b_1$, and $b_2$. This system of equations can be solved to obtain the self-heating free substrate current of transistor 102, as defined by the equation:

$$I_{SX} = b_0 + b_1 T_X + b_2 T_X^2 \qquad \text{equation (6)}$$

where $T_X$ is a desired temperature and $I_{SX}$ is the self-heating free substrate current of transistor 102 at $T_X$.

Thus, the embodiment of the invention in FIG. 3 provides a method for advantageously determining the self-heating free substrate current of a transistor, such as an SOI FET, at a desired temperature. It is noted that the invention's method, as described above, results, among other things, in an accurate current-temperature relationship or model, and also in an accurate determination of self-heating free substrate current, thereby facilitating designing, and improving the design and fabrication of, circuits and semiconductor dies to achieve performance and characteristics that closely match the simulated or anticipated behavior of such circuits and semiconductor dies.

Figure 4:
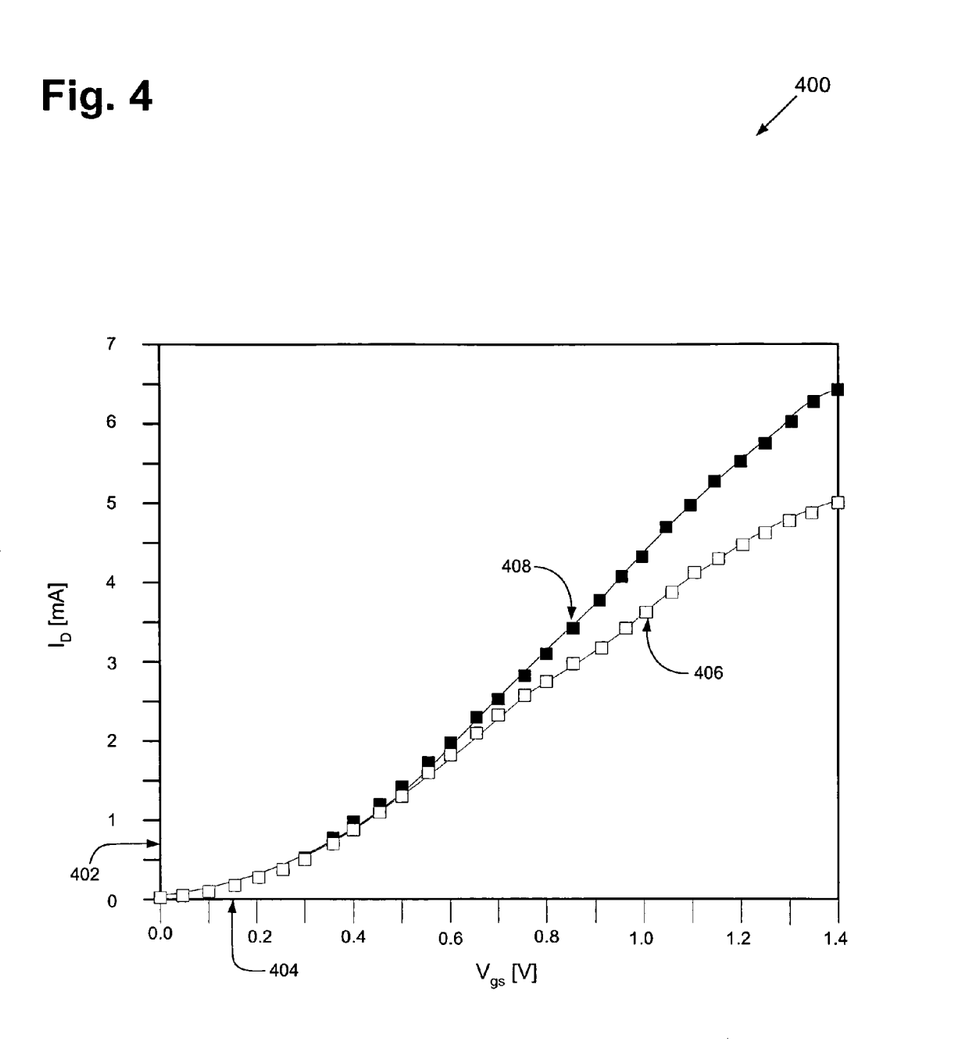
FIG. 4 shows a graph displaying the I-V characteristics of a transistor determined in accordance with one embodiment of the present invention.

FIG. 4 shows exemplary graph 400 including exemplary I-V characteristic curves of a transistor in accordance with one embodiment of the present invention. Graph 400 includes drain current axis 402 and gate/source voltage axis 404. Graph 400 also includes drain current curve 406, which plots the I-V characteristics of a transistor affected by self-heating under DC operation. Drain current curve 406 can be determined by measuring drain current and gate/source voltage data points and plotting the results, for example. Graph 400 further includes self-heating free drain current curve 408, which plots the self-heating free I-V characteristics of a transistor. Self-heating free drain current curve 408 can be determined according to the method described above in flowchart 200 in FIG. 2, for example.

As shown in graph 400, self-heating free drain current curve 408 deviates substantially from self-heating drain current curve 406 as the gate/source voltage increases. Because self-heating drain current curve 406 suffers from self-heating caused by drain current flowing through a transistor, such as transistor 102 in FIG. 1, during DC operation, any models extracted from this curve for purpose of circuit design would be inaccurate. However, by using the method described above in flowchart 200 in FIG. 2, the present invention determines self-heating free drain current in a transistor under DC operation to advantageously achieve accurate self-heating free I-V characteristics. The self-heating free I-V characteristics as determined by the present invention can be advantageously used for accurate and efficient transistor modeling for circuit design.

Figure 5:
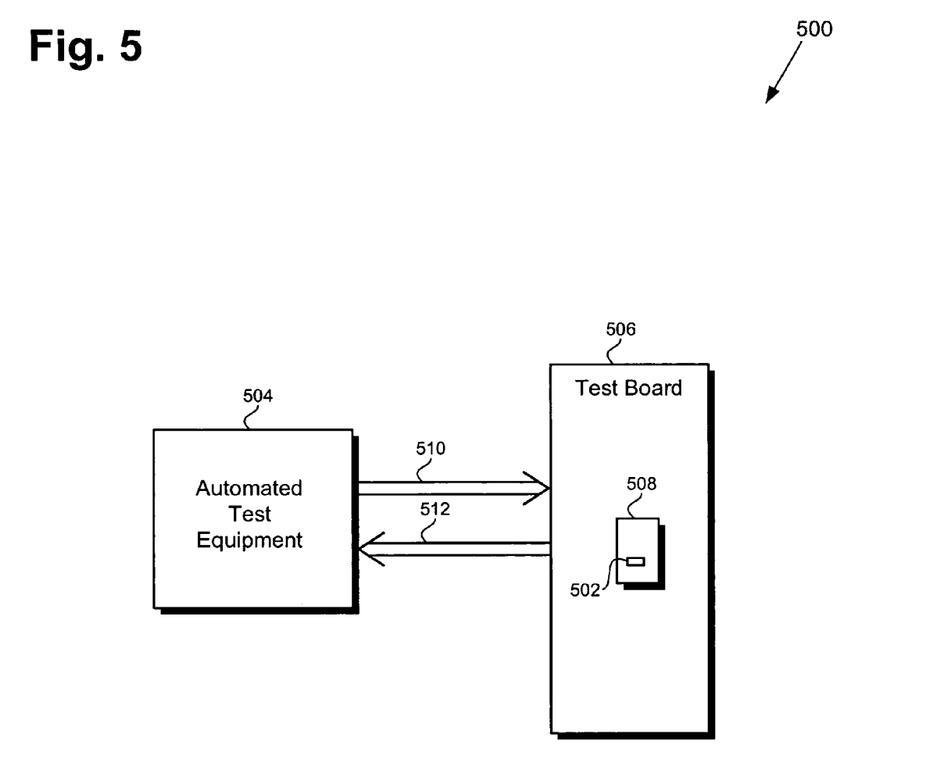
FIG. 5 illustrates a diagram of an exemplary test system for determining self-heating free drain or substrate current of an exemplary transistor in accordance with one embodiment of the present invention.

FIG. 5 illustrates a diagram of an exemplary test system including an exemplary semiconductor die comprising an exemplary transistor, where the test system is utilized to implement one or more embodiments of the invention's method described above. Test system 500 includes automated (i.e. computerized) test equipment 504 and test board 506. Test board 506 includes and interfaces with semiconductor die 508, which can include transistor 502. Transistor 502 corresponds to transistor 102 in FIGS. 1A and 1B. In one embodiment, test system 500 can include automated test equipment 504 directly interfacing a semiconductor wafer situated on a wafer chuck, instead of interfacing test board 506 and die 508. In such embodiment, the semiconductor wafer can include a transistor, such as transistor 102 in FIGS. 1A and 1B.

As shown in FIG. 5, test board 506 is coupled to automated test equipment 504 via buses 510 and 512. Test board 506 can include a number of interconnect traces (not shown in FIG. 5) to couple automated test equipment 504 to the appropriate contact pads on transistor 502 or semiconductor die 508. Although in the present embodiment semiconductor die 508 is mounted on test board 506, in other embodiments semiconductor die 508 may not be mounted on test board 506, and may be connected directly to automated test equipment 504 via a number of probes and buses 510 and 512.

Automated test equipment 504 can be configured to apply suitable DC operating voltages, such as drain voltage, gate voltage, and substrate voltage, to the appropriate contact pads of transistor 502 or semiconductor die 508. Automated test equipment 504 can be further configured to determine the self-heating free drain current of transistor 502 by utilizing the method of flowchart 200 in FIG. 2. Automated test equipment 504 can be further configured to determine the self-heating free substrate current of transistor 502 by utilizing the method of flowchart 300 in FIG. 3. It is noted that test system 500 implementing the invention's method, as earlier described, results, among other things, in establishing an accurate current-temperature relationship or model, and also in an accurate determination of self-heating free drain and substrate currents, thereby facilitating designing, and improving the design and fabrication of, circuits and semiconductor dies to achieve performance and characteristics that closely match the simulated or anticipated behavior of such circuits and semiconductor dies.

Thus, as discussed above, in the respective embodiments in FIGS. 2 and 3, the invention advantageously implements a method for determining self-heating free drain and substrate currents of a transistor, such as an SOI FET, under DC operation, thereby allowing for effective and accurate modeling based on the self-heating free I-V characteristics of the transistor. In contrast, conventional techniques for acquiring self-heating free I-V characteristics of transistors, and more specifically for SOI (substrate-on-insulator) transistors, can require elaborate and costly testing setups that provide inefficient and/or inaccurate results.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a method for determining self-heating free I-V characteristics of a transistor has been described.

The invention claimed is:

1. A method for execution in a processor of an automated test apparatus, said method for determining a self-heating free drain current in a transistor, wherein said processor is configured to execute steps of:
  measuring at least three unique drain currents corresponding to at least three unique ambient temperatures while keeping all DC operating voltages of said transistor constant;
  determining at least three unique channel temperatures corresponding to said at least three unique drain currents;
  determining said self-heating free drain current of said transistor.

2. The method of claim 1 further comprising establishing a current-temperature relationship for said transistor, and utilizing said current-temperature relationship to determine said self-heating free drain current.

3. The method of claim 2 further comprising fabricating a semiconductor die utilizing said current-temperature relationship.

4. The method of claim 2, wherein said current-temperature relationship is defined by $I_{D,i} = a_0 + a_1 T_{D,i} + a_2 T_{D,i}^2$, wherein $T_{D,i}$ is one of said at least three unique channel temperatures and $I_{D,i}$ is said self-heating free drain current at said $T_{D,i}$.

5. The method of claim 2, wherein said step of determining said at least three unique channel temperatures comprises determining at least three unique temperature increases of said transistor corresponding to said at least three unique drain currents.

6. The method of claim 5, wherein each of said at least three unique channel temperatures is equal to a sum of a corresponding one of said at least three unique ambient temperatures and a corresponding one of said unique temperature increases of said transistor.

7. The method of claim 5, wherein each one of said three unique temperature increases of said transistor is equal to $I_{D,i} \cdot V_{DS} \cdot R_{th0} / W$, wherein $I_{D,i}$ is a corresponding one of said at least three unique drain currents, $V_{DS}$ is a drain to source voltage of said transistor, $R_{th0}$ is a normalized thermal resistance of said transistor, and W is a channel width of said transistor.

8. The method of claim 2, wherein said transistor is a silicon-on-insulator FET.

9. A method for execution in a processor of an automated test apparatus, said method for determining a self-heating free substrate current in a transistor, wherein said processor is configured to execute steps of:
  measuring at least three unique drain currents and at least three unique substrate currents corresponding to at least three unique ambient temperatures while keeping all DC operating voltages of said transistor constant;
  determining at least three unique channel temperatures corresponding to said at least three unique drain currents, thereby establishing a current-temperature relationship for said transistor;
  determining said self-heating free substrate current of said transistor utilizing said current-temperature relationship.

10. The method of claim 9 further comprising fabricating a semiconductor die utilizing said current-temperature relationship.

11. The method of claim 9, wherein said current-temperature relationship is defined by $I_{S,i}=b_0+b_1 T_{D,i}+b_2 T_{D,i}^2$, wherein $T_{D,i}$ is one of said at least three unique channel temperatures and $I_{S,i}$ is said self-heating free substrate current at said $T_{D,i}$.

12. The method of claim 9, wherein said step of determining said at least three unique channel temperatures comprises determining at least three unique temperature increases of said transistor corresponding to said at least three unique drain currents.

13. The method of claim 12, wherein each of said at least three unique channel temperatures is equal to a sum of a corresponding one of said at least three unique ambient temperatures and a corresponding one of said unique temperature increases of said transistor.

14. The method of claim 9, wherein said transistor is a silicon-on-insulator FET.

15. A test system comprising automated test equipment coupled to a semiconductor die, said semiconductor die comprising a transistor, said automated test equipment determining a self-heating free drain current in said transistor by using a method comprising steps of:

measuring at least three unique drain currents corresponding to at least three unique ambient temperatures while keeping all DC operating voltages of said transistor constant;

determining at least three unique channel temperatures corresponding to said at least three unique drain currents, thereby establishing a current-temperature relationship for said transistor;

determining said self-heating free drain current of said transistor utilizing said current-temperature relationship.

16. The test system of claim 15, wherein said current-temperature relationship established by said test system is utilized in fabricating a semiconductor die.

17. The test system of claim 15, wherein said current-temperature relationship is defined by $I_{D,i}=a_0+a_1 T_{D,i}+a_2 T_{D,i}^2$, wherein $T_{D,i}$ is one of said at least three unique channel temperatures and $I_{D,i}$ is said self-heating free drain current at said $T_{D,i}$.

18. The test system of claim 15, wherein said transistor is a silicon-on-insulator FET.

* * * * *